(12) United States Patent
Pullen

(10) Patent No.: US 6,249,182 B1
(45) Date of Patent: Jun. 19, 2001

(54) CLASS D AMPLIFIER WITH BANDWIDTH INDEPENDENT OF LOAD IMPEDANCE

(75) Inventor: Stuart W. Pullen, Raleigh, NC (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/437,393

(22) Filed: Nov. 10, 1999

Related U.S. Application Data
(60) Provisional application No. 60/109,085, filed on Nov. 18, 1998.

(51) Int. Cl.[7] ..................................................... H03F 3/38
(52) U.S. Cl. ......................... 330/10; 330/207 A; 330/251
(58) Field of Search ................................. 330/10, 207 A, 330/251; 381/121

(56) References Cited

U.S. PATENT DOCUMENTS

| | | | |
|---|---|---|---|
| 4,458,208 | * | 7/1984 | Abe ........................................ 330/10 |
| 5,410,592 | * | 4/1995 | Wagner et al. ....................... 330/751 |
| 5,805,020 | * | 9/1998 | Danz et al. ............................ 330/10 |
| 5,949,282 | * | 9/1999 | Nguyen et al. ........................ 330/10 |
| 6,107,875 | * | 8/2000 | Pullen et al. ........................... 330/10 |

FOREIGN PATENT DOCUMENTS

1575291 * 6/1990 (RU) ...................................... 330/10

* cited by examiner

Primary Examiner—Michael B Shingleton
(74) Attorney, Agent, or Firm—Jaeckle Fleischmann & Mugel, LLP

(57) ABSTRACT

A high Q low pass filter removes the carrier from a Class D amplifier. Speaker impedance varies with frequency, and it is desirable for to drive 2, 4 and 8 ohm speakers. The bandwidth feedback compensation network 800 adds a pole-zero combination to the feedback loop to reduce the Q of the low pass filter and to maintain the bandwidth of the amplifier.

6 Claims, 5 Drawing Sheets

FIG. 4B BUTTERWORTH FILTER

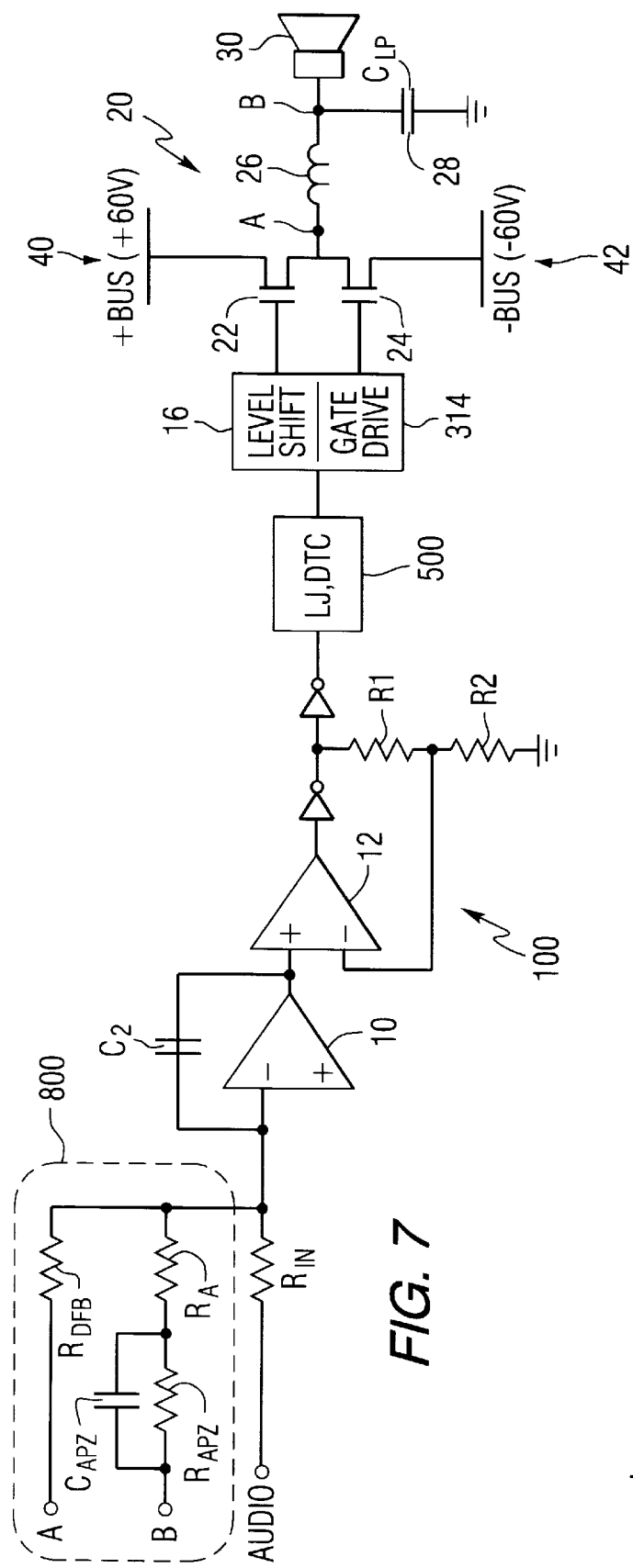
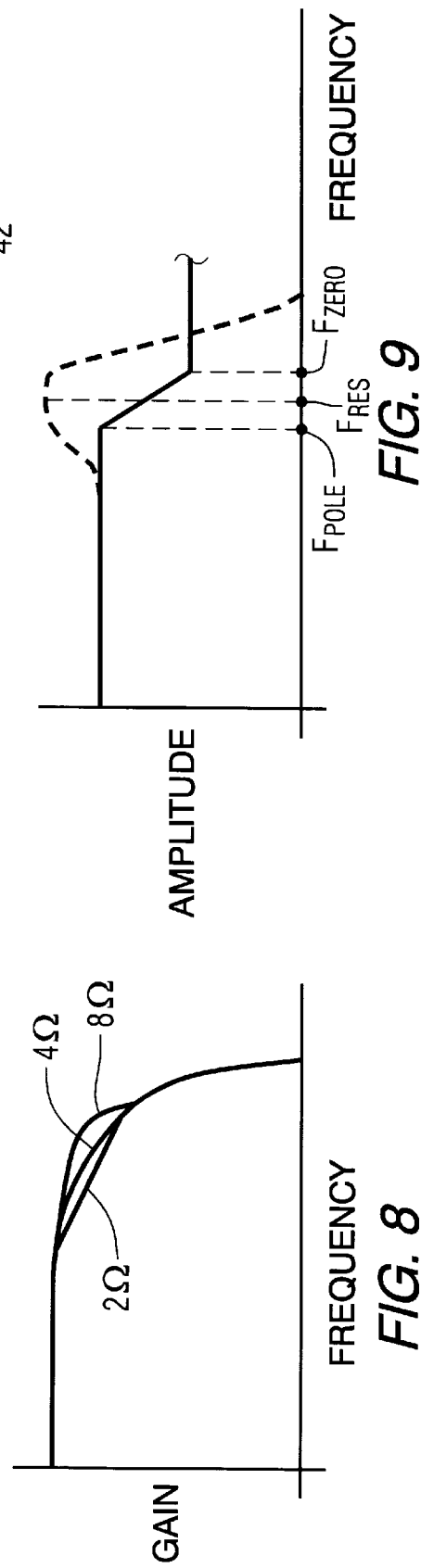
FIG. 7
FIG. 8
FIG. 9

CLASS D AMPLIFIER WITH BANDWIDTH INDEPENDENT OF LOAD IMPEDANCE

This application is a conversion of U.S. Provisional Application Ser. No. 60/109,085, filed Nov. 18, 1998, the entire disclosure of which is incorporated by reference.

BACKGROUND OF INVENTION

Class D amplifiers use a low pass filter before the load (loudspeaker) to convert the amplified digital signal into an audio signal. The load may include speakers with impedance ranging from 2–16 Ω. A typical low pass filter of a class D amplifier is strongly dependent upon load impedance. An example of the typical low pass filter is shown in FIGS. 1 and 4. It includes the inductor L and the capacitor $C_{LP}$. The low pass filter has a Laplace transfer function as follows:

$$H(s) = \frac{1}{s^2 LC + \frac{Ls}{R} + 1}$$

In conventional Butterworth, Bessel and linear phase filters, the terms $s^2 LC$ and $Ls/R$ are on the same order of magnitude. Thus, the transfer function depends strongly on the load impedance. The first step for creating a transfer function that is independent of load impedance is to make sure that the term $s^2 LC \gg Ls/R$. Unfortunately, this approach results in a high quality (Q) factor filter which exhibits peaking at a resonant frequency $$FRES = \frac{1}{2\pi \sqrt{fC}}.$$

as shown in FIG. 2. Such peaking is unacceptable in audio amplifiers where the gain must be flat throughout the audio bandwidth.

One prior art solution to the problem places an impedance balancing filter, also known as a Zobel filter, at the output. An example of a Zobel filter is shown in FIG. 3A. Its frequency response is shown in FIG. 3B. Although the Zobel filter reduces the Q of the low pass output filter and results in less peaking, it is costly and inefficient because the resistor in the Zobel network dissipates a significant fraction of the carrier as heat. This dissipation increases the cost of the Zobel network because the components must be chosen to handle this power. Since the Zobel network has a low impedance at ultrasonic frequencies, it limits the power bandwidth of the class D amplifier. If the input signal is not band limited, the Zobel may overheat and fail. The amplifier may still function, but without the Zobel, the peaking at high frequency will be audible.

SUMMARY

This invention solves the functional and economic problems of the prior art by providing a filter that places a pole-zero combination in the feedback loop of the amplifier to effectively compensate for the high Q output filter. In the Laplace transform of a system, zeros are the roots of the numerator of the transfer function and poles are roots of the denominator. In the preferred embodiment, the feedback network comprises two resistors and a capacitor in parallel with one of the resistors. The feedback network reduces the gain of the amplifier to compensate for the high Q of the output filter.

The invention provides a class D amplifier that has a bandwidth that is almost independent of the load impedance. The amplifier includes a pulse width modulator that comprises an integrator with feedback from the output of the amplifier and a comparator coupled to the output of the integrator for converting an input analog audio signal into a digital audio signal. The output of the amplifier is coupled to a bridge driver circuit which in turn controls the gate terminals of the mosfets of a half bridge. The half bridge output is connected to a low pass high Q output filter. The output filter is connected to a load impedance such as a speaker. This load may vary between 2–16 ohms. A feedback compensation network for reducing the Q of the output filter comprises two resistors with a capacitor in parallel with one of the resistors.

DRAWINGS

FIG. 4B is the frequency response of the amplifier in FIG. 4;

FIG. 7 is a schematic of a class D amplifier with the load compensation network;

FIG. 8 is the frequency response of the amplifier in FIG. 7;

FIG. 9 is the frequency response of the low pass filter and the load compensation network;

DETAILED DESCRIPTION

Figure 1:
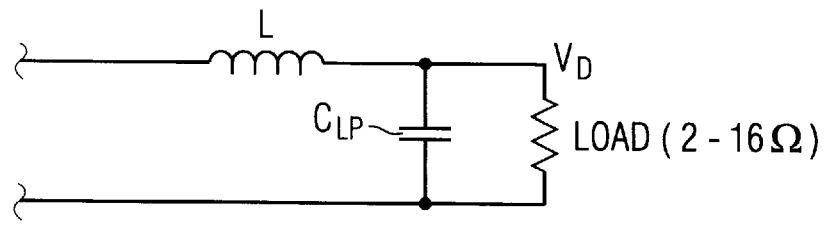
FIG. 1 is a schematic of a low pass output filter of a class D amplifier.
Figure 2:
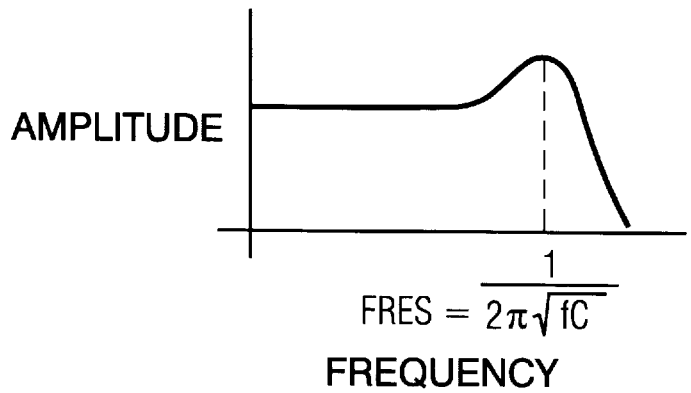
FIG. 2 is a graph of amplitude v. frequency for a high Q low pass output filter.
Figure 3A:
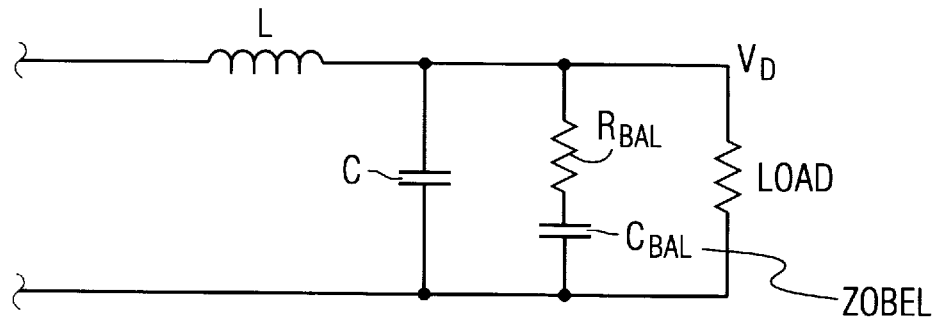
FIG. 3A is a partial schematic of a low pass filter with a Zobel network.
Figure 3B:
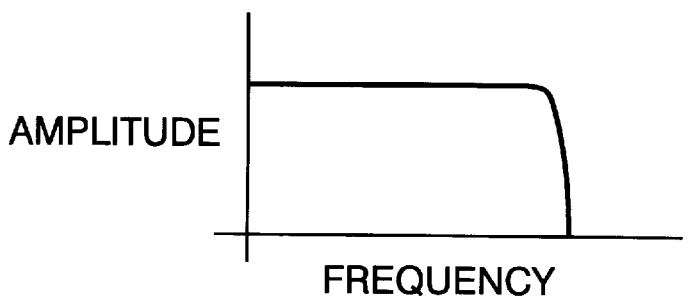
FIG. 3B is the frequency response of a high Q output filter with a Zobel network.
Figure 4A:
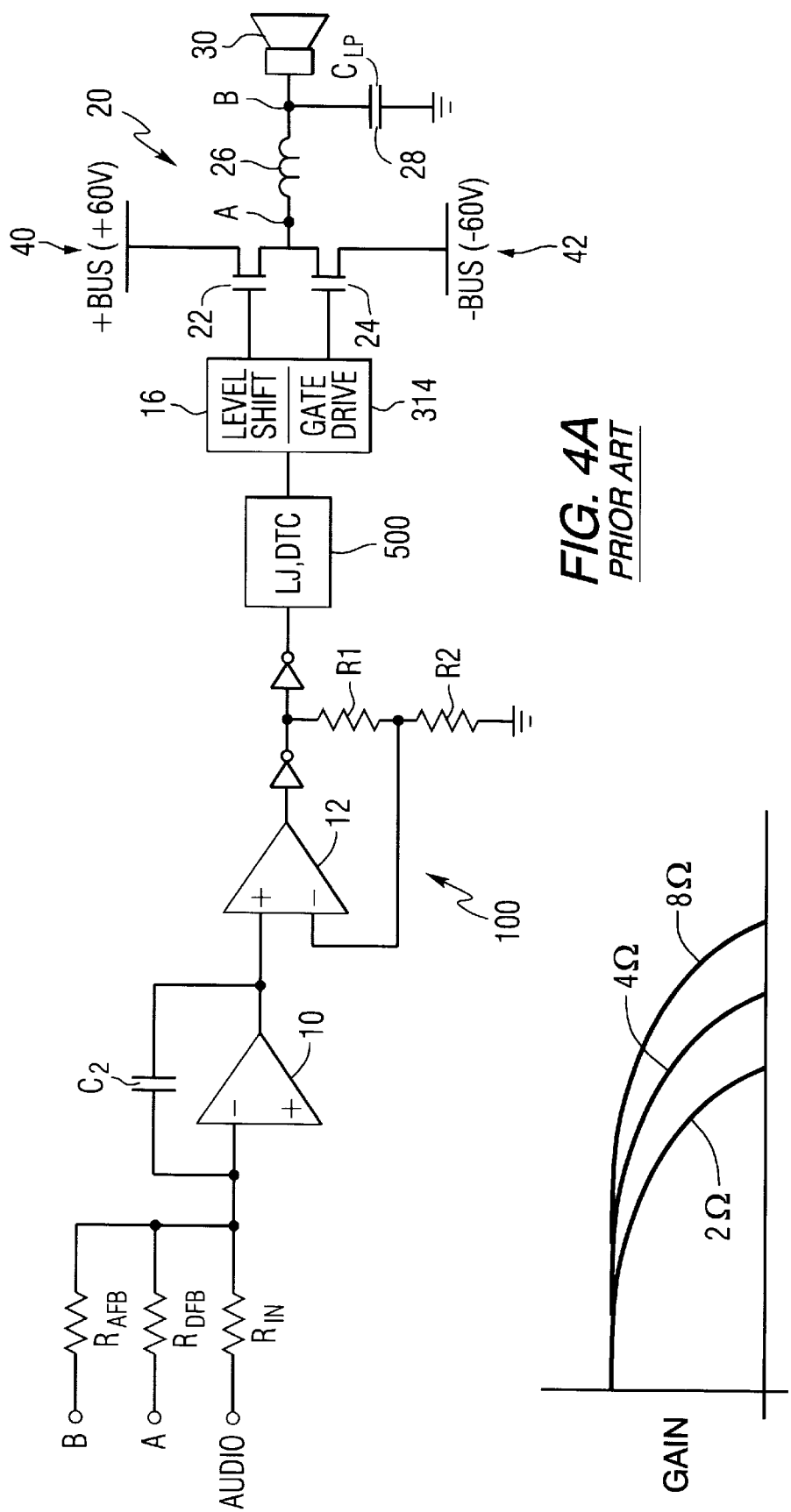
FIG. 4A is a schematic of a class D amplifier with a low Q output filter.

A prior art self-oscillating class D modulator is shown in FIG. 4. An integrator 10 has three inputs. One is an audio input over an input resistor $R_{IN}$. The second is a digital feedback input A over resistor $R_{DFB}$, and the an analog feedback over resistor $R_{AFB}$ from node B. The respective analog and digital feedback signals A, B, are taken from the output of the bridge circuit 20 and the lowpass filter that comprises the inductor L and capacitor $C_{LP}$. For purposes of understanding, let us simply focus on the digital output A and assume that there is no audio input. In this case, the output at point A is a square wave with a 50% duty cycle. When the square wave is high, current flows through $R_{DFB}$ into the summing junction of the integrator 10. Its output ramps down until it reaches the negative threshold of the comparator 12. R1 and R2 are used to add hysteresis to the comparator 12. These resistors can be used to adjust the comparator positive and negative thresholds. When the output of the comparator 12 goes low, the upper FET 22 turns off and after a short delay the lower FET 24 turns on. The square wave goes low, and current now flows out of the integrator 10 summing junction through $R_{DFB}$. The output of the integrator 10 reverses and ramps up until it reaches the positive threshold of the comparator 12. This signals the lower FET 24 to turn off. After a short delay the upper FET 22 turns on. The square wave goes high and the cycle continues. With no audio signal, the output at A is a 50% square wave, and the output of the integrator 10 is a triangle wave.

Half bridge 20 includes NMOS FETS 22,24. They are connected in series between high voltage bus 40 (+60 volts) and low voltage bus 42 (−60 volts). Gate driver 314 and level shifter 16 control the operation of the FETS 22,24. The dead time control circuit 500 is coupled between the output of the modulator 12 and the gate driver 314. At the series connection of the two MOSFETS, their output is coupled to a low pass filter that comprises inductor 26 and capacitor 28. The low pass filter converts the digital output of the bridge 20 to an audio output that drives the load, loudspeaker 30. This filter is typically a Butterworth, Bessel or linear phase filter. Unfortunately, as the impedance of the load varies so does the bandwidth of the amplifier. See FIG. 4A that shows how the bandwidth of the amplifier response changes when the load impedance varies from 8 to 4 to 2 ohms. Such variation is unacceptable.

Figure 5:
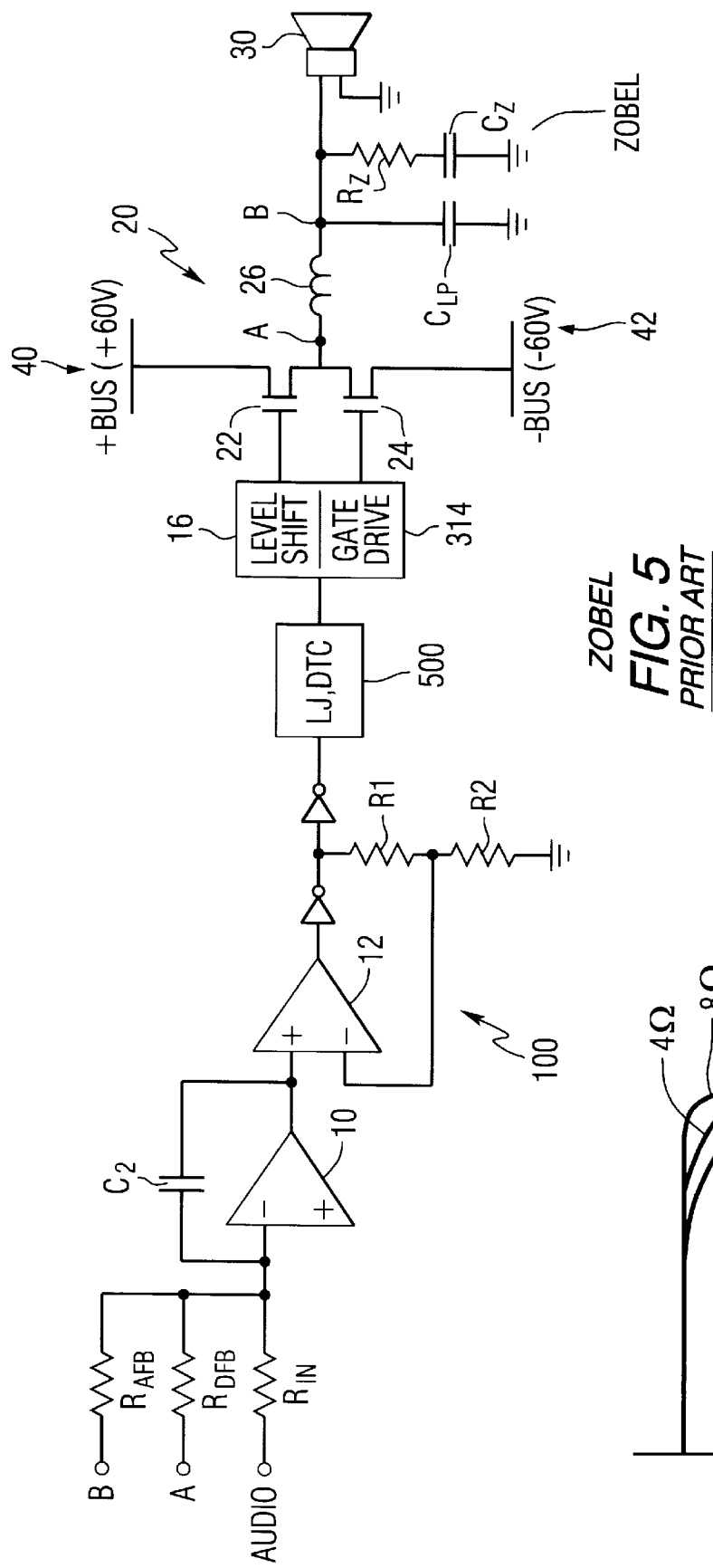
FIG. 5 is a schematic of a class D amplifier using a Zobel network with a high Q filter.

FIG. 5 shows a prior art solution which uses a high Q output filter with a Zobel network. The corresponding components of the amplifier are the same as in FIG. 4. The Zobel network of $R_Z$ and $C_Z$ is added in parallel with the speaker as shown. While this approach does achieve a bandwidth almost independent of load, the Zobel network is expensive and limits the power bandwidth of the amplifier. Also, the resistor $R_Z$ must dissipate between 10 and 20 watts of power. The DC gain of this amplifier is given by:

$$\text{Gain} = (R_{AFB} \| R_{DFB})/R_{IN}$$

Figure 6:
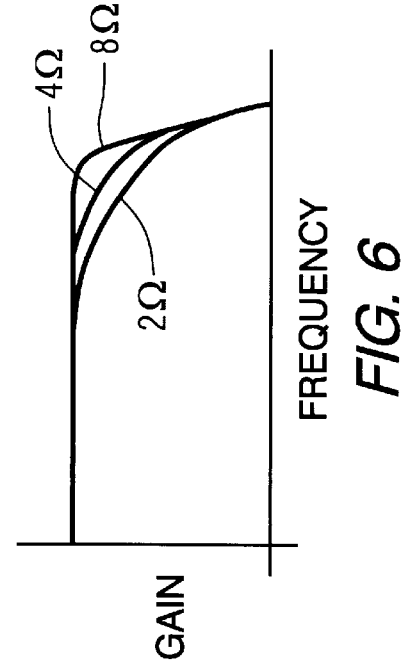
FIG. 6 is the frequency response of the amplifier in FIG. 5.

The frequency response shown in FIG. 6 demonstrates an improvement in reduction of the high Q of the amplifier. The improvement is possible for loads of 2–8 ohms. However, as discussed above, the Zobel filter is costly, inefficient and limits the bandwidth of the amplifier.

FIG. 7 shows a class D amplifier with a load and bandwidth compensation circuit 800 which includes a parallel connection of capacitor $C_{APZ}$ and resistor $R_{APZ}$ in series with another resistor $R_A$. The analog feedback signal A is coupled to the input of the bandwidth compensation circuit 800. The output of the compensation circuit 800 is coupled to the input to the integrator 10 of the class D amplifier 100. The gain of the amplifier 100 is:

$$\text{Gain} = \{[(R_{APZ} \| Z_{CAPZ}) + R_A] \| R_{DFB}\}/R_{IN}$$

The input compensation circuit 800 of $C_{AZP}$, $R_{AZP}$ and $R_A$ form a pole-zero combination that can be adjusted to compensate for the high Q of the output filter. The compensations circuit 800 generates a pole to roll off the loop gain of the amplifier at a frequency before the resonant frequency of the low pass filter. That pole counteracts the low pass resonance. The zero generated by circuit 800 extends the frequency response of the amplifier to 100 kHz. Without the zero, the amplifier would roll off too soon. The frequency response for an amplifier with circuit 800 is shown in FIG. 9. The low pass resonant frequency, the pole frequency and the zero frequency are as follows:

$$F_{RES} = \frac{1}{2\pi\sqrt{LC_{LP}}} \qquad F_{POLE} = \frac{1}{2\pi C_{APZ} R_{APZ}} \qquad F_{ZERO} = \frac{1}{2\pi C_{APZ} R_A}$$

Typical component values produce the desired result that is a flat frequency response independent of load (speaker) impedance. In one circuit the values for the components was as follows: $C_{APZ}$=330 pico farads, $R_{APZ}$=20 kΩ, $R_A$=10 kΩ, L=20$\mu$ henries, $C_{LP}$=$\mu$ farads RDBF=62 kΩ, C2=680 pico farad, and the speaker load 30=4 or 8 Ω. See the frequency response curve of FIG. 8. FIG. 9 shows the response of the pole-zero combination of the compensation circuit 800 along with the response of the output filter. The pole of the compensation network 800 is chosen 4–5 kHz below the resonant frequency of the low pass filter. The zero is chosen so that the amplifier exhibits a flat frequency response. Those skilled in the art may use conventional skills for selecting suitable values of resistors and capacitors to achieve the desired results shown in FIG. 9.

Figure 10:
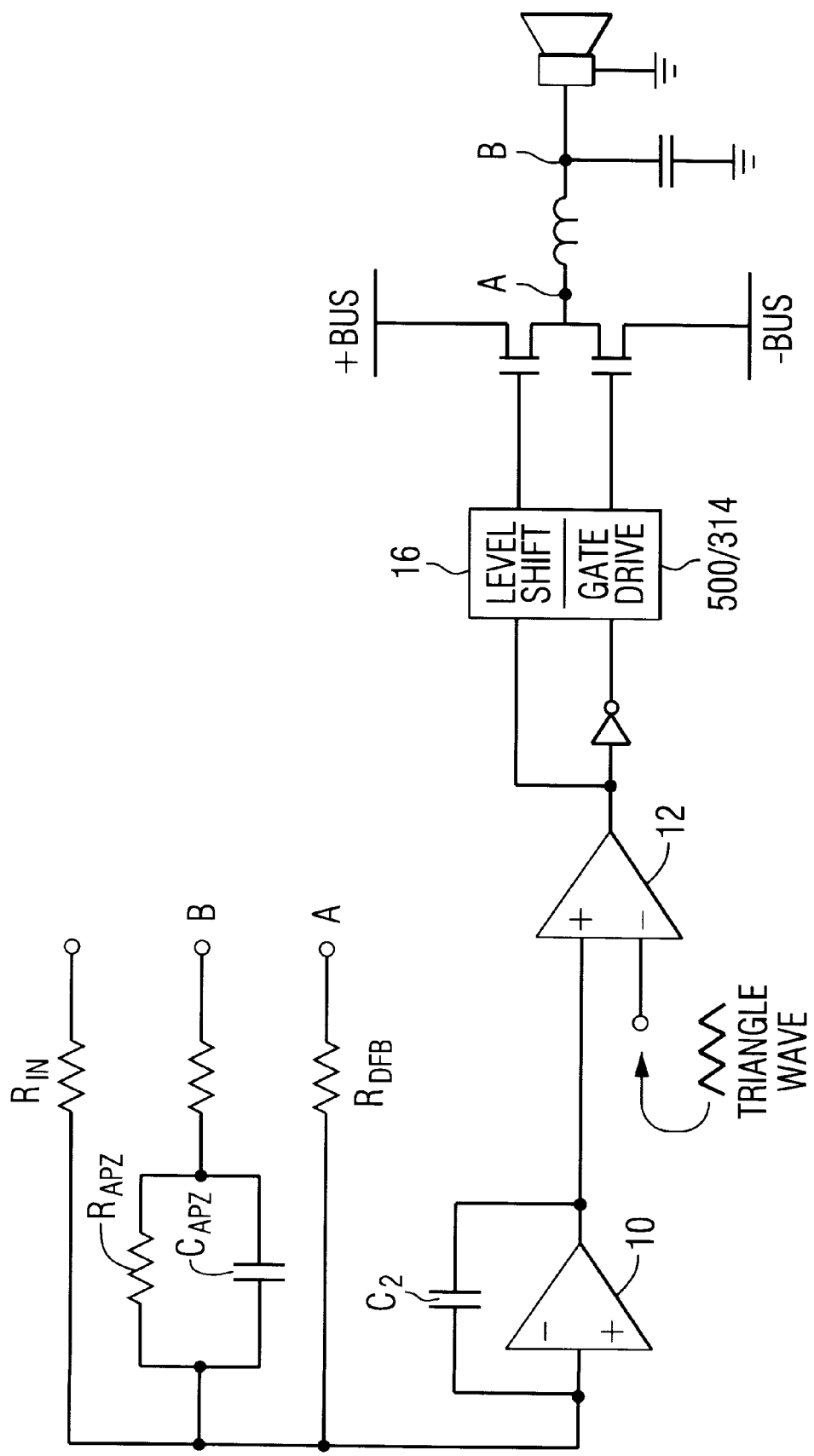
FIG. 10 shows an embodiment with a separate oscillator input.

The invention may also be used with a pulse width modulator having a separate oscillator input. See FIG. 10. Note that the comparator 12 has a separate triangle wave input instead of the feedback loop shown for comparator 12 in FIG. 4.

Having thus disclosed the preferred embodiment of the invention, those skilled in the art will understand that modifications, changes, additions and deletions may be made to the invention without departing from the spirit and scope of the attached claims.

What is claimed is:

1. A class D amplifier for driving a load impedance and having a bandwidth substantially independent of the load impedance, comprising in combination:

a pulse width modulator including an integrator with feedback from the output of the amplifier and a comparator coupled to the output of the integrator for converting an input analog audio signal into a digital audio signal and for amplifying said digital audio signal;

a low pass high Q output filter coupled between the output of the pulse width modulator and the load impedance for converting the amplified digital signal into an output amplified analog audio signal;

a feedback compensation circuit coupled between the output of the low pass filter and the integrator for reducing the Q of the output filter.

2. The class D amplifier of claim 1 wherein the feedback compensation circuit includes a pole-zero compensation circuit to compensate for the high Q of the output filter.

3. The class D amplifier of claim 1 where the feedback compensation network comprises a first resistor and a capacitor connected together in parallel and said first resistor and capacitor connected in series to a second resistor for generating a pole at a frequency lower than the resonant frequency of the low pass filter.

4. The class D amplifier of claim 1 further comprising a gate driver and a MOSFET half bridge coupled between the output of the pulse width modulator and the low pass high Q output filter.

5. The class D amplifier of claim 1 further comprising a feedback loop coupled to the pulse width modulator for generating an oscillator signal for the pulse width modulator.

6. The class D amplifier of claim 1 further comprising an oscillator coupled to the pulse width modulator.

* * * * *